United States Patent
Schat et al.

(10) Patent No.: US 11,416,378 B2
(45) Date of Patent: Aug. 16, 2022

(54) INTEGRATED CIRCUIT DEVICE WITH INTEGRATED FAULT MONITORING SYSTEM

(71) Applicant: NXP BV, Eindhoven (NL)

(72) Inventors: Jan-Peter Schat, Hamburg (DE); Xavier Hours, Tournefeuille (FR); Andres Barrilado Gonzalez, Toulouse (FR)

(73) Assignee: NXP B.V., Eindhoven (NL)

( * ) Notice: Subject to any disclaimer, the term of this patent is extended or adjusted under 35 U.S.C. 154(b) by 677 days.

(21) Appl. No.: 16/411,052

(22) Filed: May 13, 2019

(65) Prior Publication Data

US 2020/0073786 A1 Mar. 5, 2020

(30) Foreign Application Priority Data

Aug. 29, 2018 (EP) .................................. 18306142

(51) Int. Cl.
G06F 11/00 (2006.01)
G06F 11/36 (2006.01)
G01R 31/3167 (2006.01)
G01R 31/3181 (2006.01)
G06F 11/26 (2006.01)

(52) U.S. Cl.
CPC ...... G06F 11/3672 (2013.01); G01R 31/3167 (2013.01); G01R 31/3181 (2013.01); G06F 11/261 (2013.01)

(58) Field of Classification Search
CPC ............... G06F 11/261; G06F 11/3672; G01R 31/3167; G01R 31/3181
See application file for complete search history.

(56) References Cited

U.S. PATENT DOCUMENTS

| 5,428,624 | A | * | 6/1995 | Blair | G01R 31/318547 |
| | | | | | 714/E11.167 |
| 6,367,043 | B1 | * | 4/2002 | Damaria | G01R 31/3167 |
| | | | | | 714/736 |
| 7,689,866 | B2 | | 3/2010 | Chakraborty | |
| 8,073,668 | B2 | | 12/2011 | Kellington et al. | |
| 9,429,625 | B1 | | 8/2016 | Ding et al. | |
| 9,698,809 | B1 | | 7/2017 | Mallett | |
| 10,261,880 | B1 | * | 4/2019 | Levin | G06F 11/2289 |
| 2002/0095624 | A1 | * | 7/2002 | Cabezas | G06F 11/221 |
| | | | | | 714/E11.161 |

(Continued)

FOREIGN PATENT DOCUMENTS

| CN | 104198912 A | 12/2014 |
| CN | 105005015 A | 10/2015 |

OTHER PUBLICATIONS

"Octal squib driver and quad sensor interface ADIC for safety application"; Doc ID 14219, Rev 3; Sep. 2013; 64 pgs.

(Continued)

*Primary Examiner* — Joshua P Lottich

(57) ABSTRACT

An integrated circuit device is disclosed. The device includes a circuit configured to perform a function, a fault management component, at least one user register, an analog test bus component, a built-in self-test component, a safety monitor component, and gating logic. Additionally, the circuit is separated from the fault management component, the at least one user register, the analog test bus component, the built-in self-test component, the safety monitor, and the gating logic.

19 Claims, 5 Drawing Sheets

(56) References Cited

U.S. PATENT DOCUMENTS

| | | | |
|---|---|---|---|
| 2004/0057391 A1* | 3/2004 | Polyakov | H04L 29/06 370/258 |
| 2006/0059395 A1 | 3/2006 | Su et al. | |
| 2015/0241553 A1 | 8/2015 | Gehrels et al. | |
| 2016/0110274 A1 | 4/2016 | Ito et al. | |
| 2016/0125110 A1 | 5/2016 | Mariani et al. | |
| 2016/0292059 A1 | 10/2016 | Catherwood et al. | |
| 2017/0316134 A1 | 11/2017 | Hyodo et al. | |
| 2017/0343607 A1 | 11/2017 | Maeda et al. | |
| 2018/0145041 A1 | 5/2018 | Fkih et al. | |
| 2018/0174665 A1* | 6/2018 | Kraipak | G11C 29/36 |

OTHER PUBLICATIONS

Texas Instruments, "Quad-Channel Driver for Airbag Deployment"; TPIC71004-Q1, Feb. 2011; 9 pgs.

Gudipati, Anjana Karthik et al.; "Comparison of test parameters for on-chip measurements of analog IPs with conventional methods for a 32-bit microcontroller in CMOS 55nm embedded flash technology"; Jun. 2013; 7 pgs.

Pouget, Vincent et al.; "Time-Resolved Scanning of Integrated Circuits With a Pulsed Laser: Application to Transient Fault Injection in an ADC"; IEEE Transactions on Instrumentation and Measurement, vol. 53, No. 4; Aug. 2004; pp. 1227-1231.

"Road Vehicles—Functional safety—Part 11: Guideline on application of ISO 26262 to semiconductors"; ISO/DIS 26262-11; 2016; 184 pgs.

"Road Vehicles—Functional safety—Part 5: Product development at the hardware level"; ISO/DIS 26262-5; Nov. 15, 2011; 86 pgs.

Freescale; "Addressing the Challenges of Functional Safety in the Automotive and Industrial Markets"; Oct. 7, 2011; 8 pgs.

Nardi, Alessandra et al.; "Functional Safety Methodologies for Automotive Applications"; Nov. 2017; 10 pgs.

European Search Report, 18306142.3, dated Feb. 15, 2019.

Holler, Andrea et al.; "FIES: A Fault Injection Framework for the Evaluation of Self-Tests for COTS-Based Safety-Critical Systems", pp. 105-110, Dec. 15, 2014.

\* cited by examiner

INTEGRATED CIRCUIT DEVICE WITH INTEGRATED FAULT MONITORING SYSTEM

BACKGROUND

In the push towards smarter automobiles that can implement advanced features such as driver assistance and autonomous driving, many electronic components are being utilized. Electronic components, often referred to as Electronic Control Units (ECUs) are used in safety-critical applications such as vision systems (cameras, radar, LIDAR), anti-lock braking systems, and airbag systems. The ECUs include Functional Components (FCs), such as microcontrollers (MCUs), smart sensors, and smart actuators that include safety-critical circuits. ECUs are often connected to each other by in-vehicle networks (IVNs) that enable the ECUs to communicate.

To ensure the safety of the next generation of automobiles, the industry has moved to implement International Standardization Organization's standard (ISO) 26262, which is a functional safety standard for electrical and electronic systems. Integrated circuit (IC) devices that include safety-critical circuits for automotive applications must be designed and operated with ISO 26262 in mind.

SUMMARY

Embodiments of a device and method are disclosed. In an embodiment, an integrated circuit (IC) device is disclosed. The IC device includes a fault management component configured to manage fault monitoring of the circuit, at least one user register connected to receive control signals from the fault management component and connected to provide register values to the circuit to control an aspect of the circuit, an analog test bus component configured to establish connections to nodes in the circuit to convey analog signals to the nodes and to communicate digital signals with the fault management component, a built-in self-test component connected to the circuit to test the circuit and to communicate digital signals with the fault management component, a safety monitor component connected to the circuit to receive a signal from the circuit and to output a safety monitor signal in response to the signal received from the circuit, and gating logic configured to gate signals from the circuit and/or from the safety monitor in response to signals from the fault management component. Additionally, the circuit is separated from the fault management component, the at least one user register, the analog test bus component, the built-in self-test component, the safety monitor, and the gating logic.

In an embodiment, the fault management component is configured to process digital data.

In an embodiment, the at least one user register receives digital control signals from the fault management component.

In an embodiment, the digital control signals are used to control parameters in the circuit.

In an embodiment, the analog test bus component is configured to inject analog signals to the circuit via an analog test bus.

In an embodiment, the analog test bus component includes at least one of a digital-to-analog converter (DAC) to convert digital signals from the fault management component to analog signals for injection into the circuit, and an analog-to-digital converter (ADC) to convert analog signals from the circuit to digital signal for the fault management component.

In an embodiment, the built-in self-test component is configured to test a safety-critical circuit for parametric deviations.

In an embodiment, the safety monitor is configured to monitor at least one of temperature, supply voltage, supply noise, output signal level, inputs signal level, and frequency of a ring oscillator in response to a signal from the circuit.

In an embodiment, the at least one user register receives digital control signals from the fault management component, the analog test bus component includes an analog test bus, at least one of a digital-to-analog converter (DAC) to convert digital signals from the fault management component to analog signals for injection into the circuit, and an analog-to-digital converter (ADC) to convert analog signals from the circuit to digital signal for the fault management component, the built-in self-test component is configured to test a safety-critical circuit for parametric deviations, and the safety monitor is configured to monitor at least one of temperature, supply voltage, supply noise, output signal level, inputs signal level, and frequency of a ring oscillator in response to a signal from the circuit.

In an embodiment, the function performed by the circuit is a safety-critical function.

In an embodiment, the circuit is separated from the fault management component, the at least one user register, the analog test bus component, the built-in self-test component, the safety monitor, and the gating logic in that the circuit and the components of the fault monitoring system have at least one of separate power supply lines, separate power ground lines, separate clock signals, separate enable and/or reset signals, and separate test control signals.

A method for monitoring faults in an IC device involves at a fault management component of the IC device, controlling the injection of faults into a circuit of the IC device through user registers of the IC device, through an analog test bus component of the IC device, and through a built-in self-test component of the IC device, and at the fault management component of the IC device, receiving outputs related to the injected faults.

In an embodiment of the method, controlling the injection of faults into the circuit of the IC device through user registers of the IC device involves digitally controlling an aspect of the circuit through a register value of at least one user register of the user registers.

In an embodiment of the method, controlling the injection of faults into the circuit of the IC device through an analog test bus component of the IC device involves digitally controlling at least one switch to inject a signal into the circuit via an analog test bus.

In an embodiment of the method, controlling the injection of faults into the circuit of the IC device through a built-in self-test component of the IC device involves digitally controlling the built-in self-test component to inject a fault signal into the circuit using a built-in self-test circuit.

In an embodiment of the method, controlling the injection of faults into the circuit of the IC device through user registers of the IC device involves digitally controlling an aspect of the circuit through a register value of at least one user register of the user registers, controlling the injection of faults into the circuit of the IC device through an analog test bus component of the IC device involves digitally controlling at least one switch to inject a signal into the circuit via an analog test bus, and controlling the injection of faults into the circuit of the IC device through a built-in self-test component of the IC device involves digitally controlling the built-in self-test component to inject a fault signal into the circuit using a built-in self-test circuit.

In an embodiment of the method, the method involves at least one of gating an output from a safety monitor of the IC device during fault injection and gating an output from the circuit of the IC device during fault injection.

In an embodiment of the method, outputs related to the injected faults are received as digital values from a safety monitor of the IC device.

In an embodiment of the method, an output related to an injected fault is received as a digital state value from a safety monitor of the IC device, wherein the digital state values from the safety monitor reflect the state of an aspect of the circuit.

In an embodiment of the method, the circuit of the IC device performs a safety-critical function.

Other aspects in accordance with the invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Figure 1:
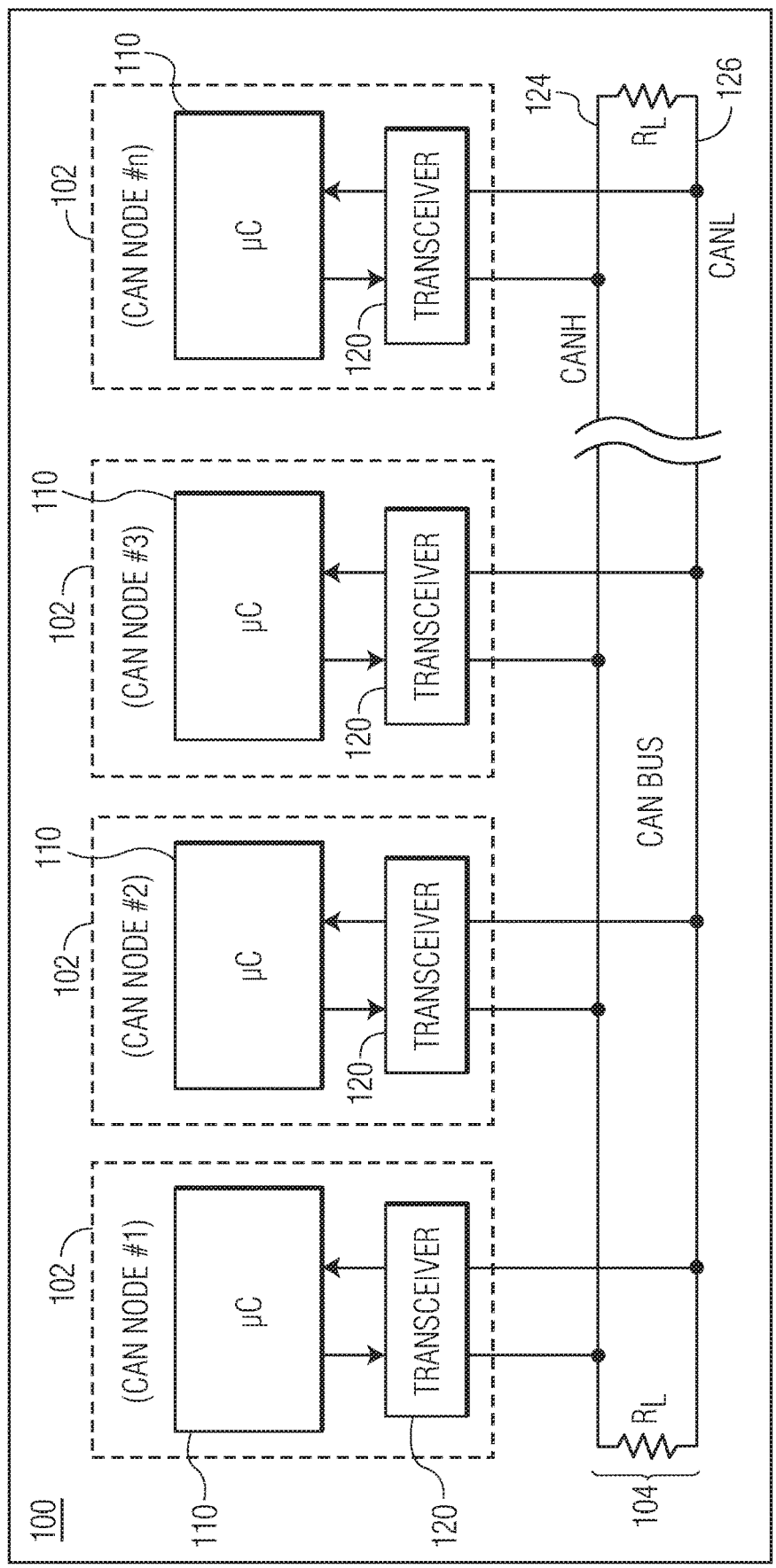
FIG. 1 depicts an example of an in-vehicle network (IVN) that includes multiple ECUs connected to a bus.

As described above, electronic control units (ECUs) with safety-critical circuits are connected to in-vehicle networks (IVNs). FIG. 1 depicts an example of an in-vehicle network (IVN) 100 that connects multiple ECUs via an IVN bus. In the example of FIG. 1, the IVN is a Controller Area Network (CAN) network that includes CAN nodes 102 (also referred to as ECUs), each connected to a CAN bus 104. In the embodiment of FIG. 1, each CAN node includes a microcontroller 110 and a transceiver 120. The microcontrollers are typically connected to at least one device (not shown) such as a sensor, an actuator, or some other control device and are programmed to determine the meaning of received messages and to generate appropriate outgoing messages. The microcontrollers, also referred to as host processors, hosts, or digital signal processors (DSPs), often include safety-critical circuits, e.g., circuits to implement vision systems (cameras, radar, LIDAR), anti-lock braking systems, and airbag systems. The transceivers 120 are located between the microcontrollers 110 and the CAN bus 104 and implement physical layer operations. The CAN bus 104 carries analog differential signals and includes a CAN high (CANH) bus line 124 and a CAN low (CANL) bus line 126. The CAN bus is known in the field. Although the IVN is described as a CAN network, other IVN technologies may be used, including, for example, FlexRay, Local Interconnect Network (LIN), and Ethernet Emerging automotive applications like Advanced Driver Assistance Systems (ADAS), autonomous driving, and X-by-wire implementations have a need for improved functional safety requirements. Following the specifications in the ISO 26262 standard, the automotive safety integrity level can be increased by implementing health monitoring functionality that detects, for example, single point failures and latent failures. Health monitoring is used to observe the degradation of functional components due to, for example, wearout. Monitoring outputs can be used to detect a failure or an imminent failure.

Functional safety of safety-critical circuits in an IC device largely depends on the correct function of safety monitors that are integrated into the IC device. Such safety monitors monitor a number of internal signals and/or states, for example, temperature, supply voltage, signal levels, signal distortion, clock duty cycle, Phase-Locked Loop (PLL) lock status, etc.

Automotive safety standards such as ISO 26262 require a minimum Diagnostic Coverage for safety-critical faults. In particular, ISO 26262 requires a minimum Diagnostic Coverage for Multiple Faults, e.g., the occurrence of faults at more than one circuit node. For example, ISO 26262 requires Diagnostic Coverage for the case of one fault in a safety-critical circuit and a concurrent fault in a safety monitor, which could lead to the case where the fault in the safety-critical circuit is not detected. Diagnostic Coverage also applies to the case in which one power line supplies both a part of the safety-critical circuit and a safety monitor, such that a single defect of the power line leads to faults in both the safety-critical circuit and in the safety monitor. Thus, there is a need for semiconductor manufacturers to provide IC devices that can meet required Multiple Fault Detection Coverage targets.

Three conventional approaches to providing Multiple Fault Detection Coverage involve Fault Tree Analysis (FTA), Failure Mode and Effects Analysis (FMEA), and fault injection. The Fault Tree Analysis approach involves specifying, for each possible pair of faults, the likelihood of occurrence and the likelihood of being detected. This approach works well when there are a limited number of easy to quantify possible faults (e.g., less than 20). However, the Fault Tree Analysis approach can be difficult to implement in the context of an IC device that may have on the order of 10,000 possible faults. The Failure Mode and Effects Analysis approach involves summarizing different failure modes seen in the Fault Tree Analysis. This approach can be more efficient than the Fault Tree Analysis approach, but the Failure Mode and Effects Analysis approach is practical in the case of approximately 100 nodes but may become impractical for IC devices with large numbers of nodes (e.g., 10,000 or more nodes). The fault injection approach involves running simulations with faults injected at different pairs of nodes. The fault injection technique is practical for up to approximately a few hundred nodes. However, the fault injection approach can become impractical because ISO 26262 also requires Diagnostic Coverage for transient faults. Injecting transient faults at different times, in different pairs of nodes, can lead to extremely long simulation times.

In an embodiment in accordance with the invention, an IC device is disclosed. The IC device includes a circuit configured to perform a safety-critical function such as a safety-critical function, a fault management component configured to manage fault monitoring of the circuit, at least one user register connected to receive control signals from the fault management component and connected to provide register values to the circuit to control an aspect of the circuit, an analog test bus component configured to establish connections to nodes in the circuit to convey analog signals to the nodes and to communicate digital signals with the fault management component, a built-in self-test component connected to the circuit to test the circuit and to communicate digital signals with the fault management component, a safety monitor component connected to the circuit to receive a signal from the circuit and to output a safety monitor signal in response to the signal received from the circuit, and gating logic configured to gate signals from the circuit and/or from the safety monitor in response to signals from the fault management component. Additionally, the circuit is separated from the fault management component, the at least one user register, the analog test bus component, the built-in self-test component, the safety monitor, and the gating logic. An IC device with such a fault monitoring system integrated on the same IC device as a circuit that performs safety-critical functions (also referred to as a "safety-critical circuit") provides a comprehensive "on-chip" solution for fault monitoring of a safety-critical circuit that can meet the requirements of ISO 26262. For example, the integrated fault monitoring system enables faults to be injected into the safety-critical circuit and enables the effects of such fault injection to be measured and documented. Additionally, the integrated fault monitoring system can support achieving and proving sufficient Multiple Fault Diagnostic Coverage as specified in ISO 26262. The integrated fault monitoring system allows faults to be injected into the safety-critical circuit during operation of the circuit and to receive feedback from a safety monitor, or safety monitors, to determine if a corresponding fault was detected. The integrated fault monitoring system can inject not only catastrophic faults, but also marginal, parametric faults into the safety-critical circuit. The circuit is separated from components of the fault monitoring system in that the circuit and the components of the fault monitoring system have separate power supply lines, separate power ground lines, separate clock signals, separate enable and/or reset signals, and/or separate test control signals. Because the circuit is separated from the fault monitoring system, the same fault/defect will not cause faults in both the circuit and the monitoring system that is supposed to be monitoring the health of the circuit.

Figure 2:
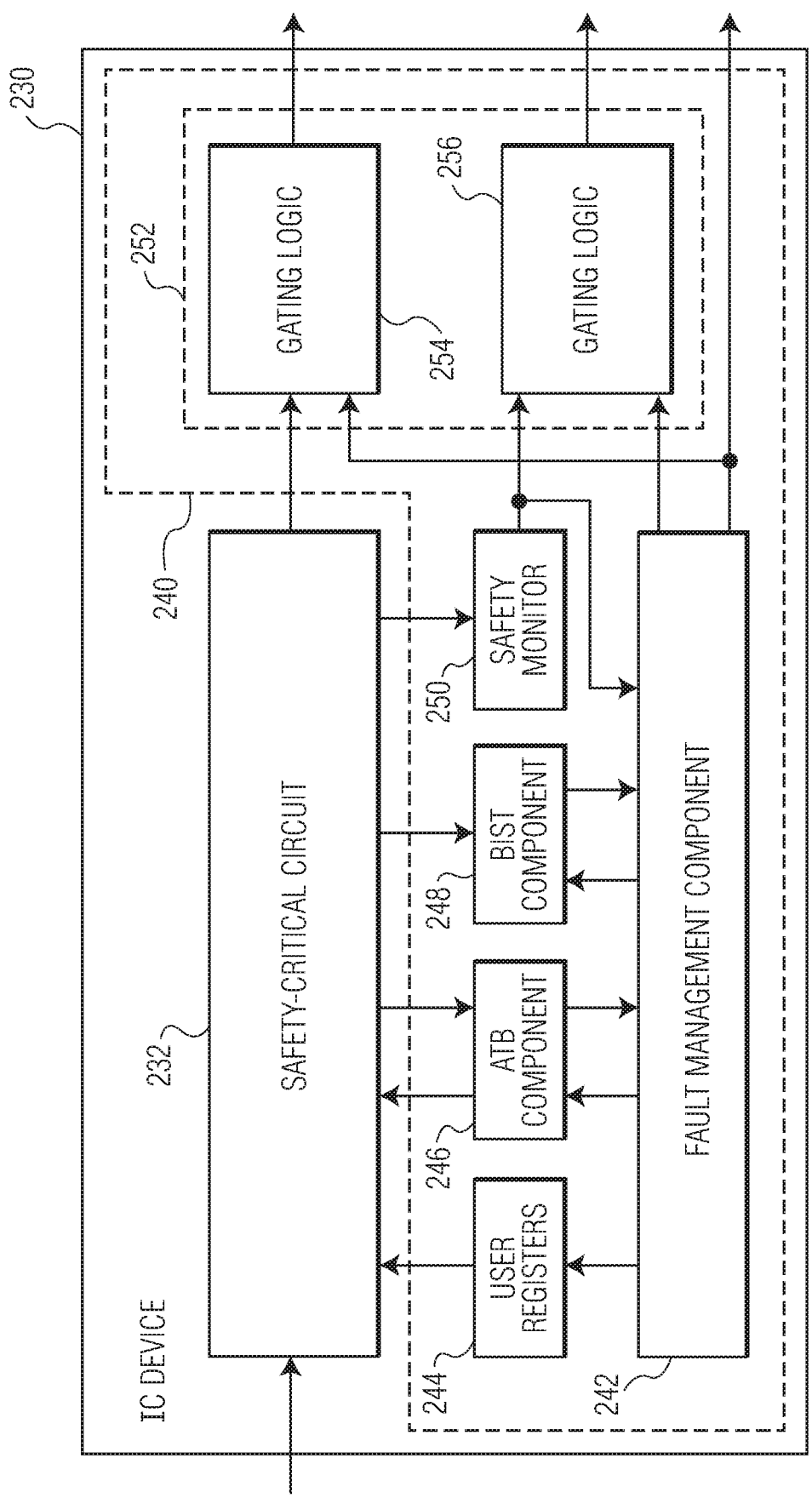
FIG. 2 depicts an example embodiment of an IC device that includes a safety-critical circuit and a fault monitoring system.

FIG. 2 depicts an example embodiment of an IC device 230 that includes a safety-critical circuit 232 and a fault monitoring system 240. In the embodiment of FIG. 2, the fault monitoring system 240 includes a fault management component 242, user registers 244, an analog test bus (ATB) component 246, a Built-In Self-Test (BIST) component 248, a safety monitor 250, and gating logic 252.

In an embodiment, the safety-critical circuit 232 of the IC device 230 may be a circuit that performs a safety-critical function in, for example, an automobile, in a medical device, or an aircraft. In an automobile, a safety-critical circuit may be found in, for example, a radar system, an airbag system, a braking system, or an engine control system. In a medical device, a safety-critical circuit may be found in, for example, a heart pacemaker or a medical supervisory circuit such as a patient monitor. In an aircraft, a safety-critical circuit may be found in, for example, a radar system or an engine control system. The safety-critical circuit may include analog circuits, digital circuits, and/or mixed-signal circuits. In an embodiment, the safety-critical circuit is part of a microcontroller, a smart sensor, and/or smart actuator. In an embodiment, a safety-critical function is a function of an IC device, which if not properly performed, can endanger a person or property.

In an embodiment, the analog test bus component 246 of the fault monitoring system 240 includes a pair of analog lines routed in the IC device 230, with analog switches that allow connection to key nodes in analog portions of the safety-critical circuit 232. Two lines are usually used for the bus because analog circuits often use differential signals. In an embodiment, key nodes in the safety-critical circuit may include inputs or outputs of sub-circuits like filters, mixers, amplifiers, limiters, frequency doublers or triplers. The analog test bus component can be used to, for example, inject voltages or currents into the nodes of the safety-critical circuit in order to inject faults, to probe voltages or currents from the nodes, in order to detect faults, and/or to connect nodes to internal components like capacitors or resistors, in order to mimic an increase or decrease of capacitance of a capacitor and/or to mimic an increase or decrease in resistance of a resistor. In an embodiment, the analog test bus component is controlled by digital signals from the fault management component 242 and includes a digital-to-analog converter (DAC) to convert the digital signals received from the fault management component to analog signals that are provided to the safety-critical circuit. The analog test bus component may also include an analog-to-digital converter (ADC) to convert analog signals received from the safety-critical circuit to digital signals that are provided to the fault management component.

Figure 3:
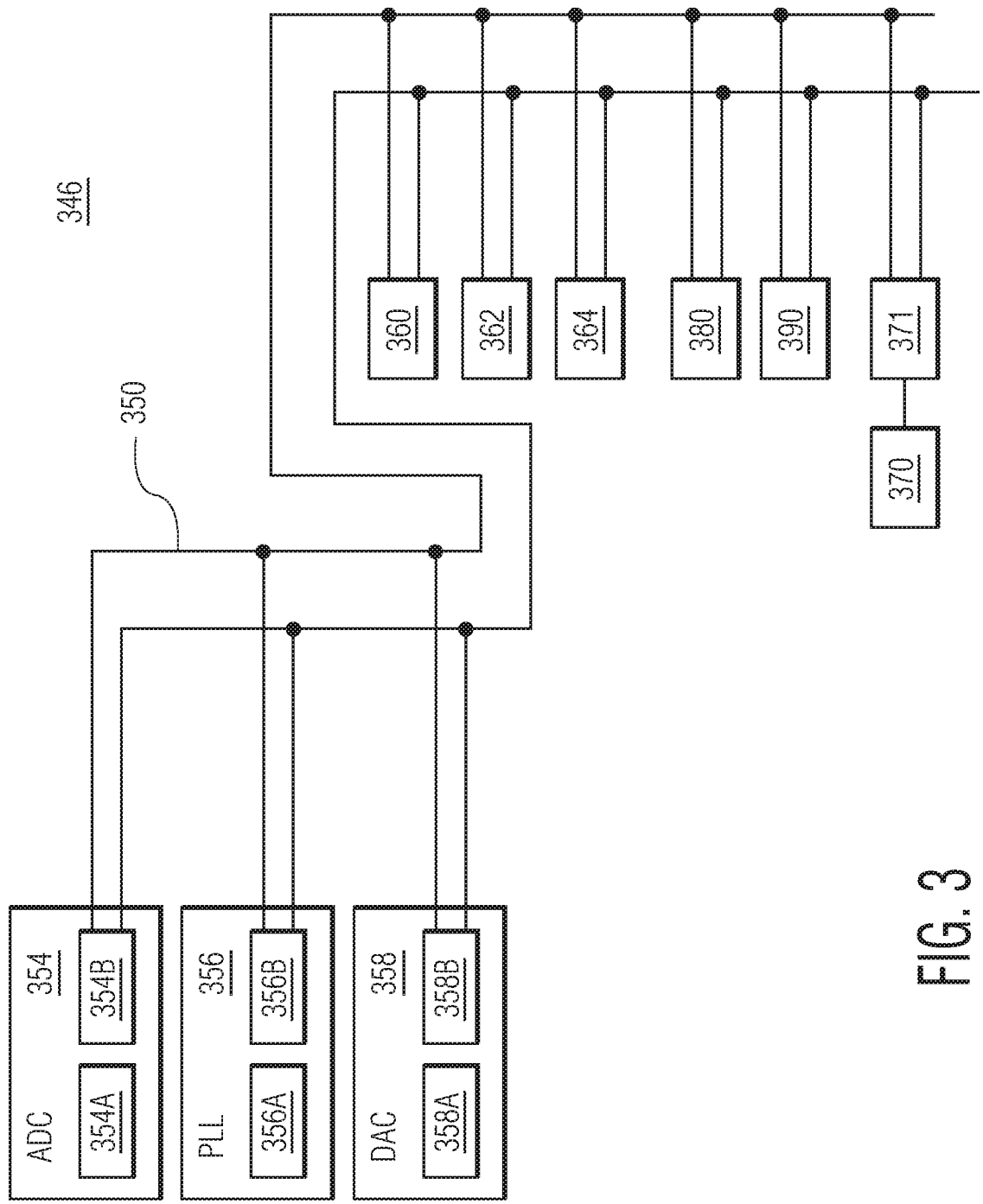
FIG. 3 depicts and example embodiment of an analog test bus component of the IC device.

FIG. 3 depicts and example embodiment of the analog test bus component 246 shown in FIG. 2. As shown in FIG. 3, an analog test bus component 346 includes a two-line analog test bus (ATB) 350, an analog-to-digital converter (ADC) module 354, including an ADC 354A and at least one switch 354B to connect to the ATB 350, a Phase-Locked Loop (PLL) module 356, including a PLL 356A and at least one switch 356B to connect to the ATB 350, and a digital-to-analog (DAC) converter module 358, including a DAC 358A and at least one switch 358B to connect to the ATB 350. The analog test bus component may be connected to nodes in the safety-critical circuit, such as power and ground test points 360, voltage references 362, and other analog circuitry 364. In an embodiment, the analog test bus component receives digital control signals from the fault management component (FIG. 2, 242) and provides digital response signals to the fault management component. Digital control signals received from the fault management component are used to control the switches of the ADC module 354, the PLL module 356, and the DAC module 358, which may include digitally controlled switches that allow different connections to be made between the analog test bus component and different nodes in the safety-critical circuit. In an embodiment, the ATB 350 is connected to IC pads 370 that are controlled in their input/output direction by a control unit 371. In an embodiment, the ATB 350 can be controlled by a DAC 380, which is used for testing purposes. In an embodiment, the ATB 350 can be observed by an ADC 390, which is used for testing purposes. Although an example of an analog test bus component is shown in FIG. 3, other embodiments of the analog test bus component are possible.

Referring back to FIG. 2, in an embodiment, the safety monitor 250 of the fault monitoring system 240 includes a monitor circuit to monitor one or more signals or states that control an aspect of the safety-critical circuit 232. For example, the safety monitor may include a circuit to measure, for example, temperature, supply voltage, supply noise, output signal level, input signal level, and/or the frequency of a ring oscillator to measure circuit aging. In an embodiment, the safety monitor provides a digital output that reflects the state of an aspect of the safety-critical circuit, e.g., pass/fail or ok/not ok. In an embodiment, there may be more than one safety monitor on the IC device 230. In an embodiment, a safety-relevant value for a safety monitor could be an absolute value of, for example, temperature, supply voltage etc., but a safety-relevant value may as well be the difference between similar values. For example, if there are multiple instances of identical modules, then a safety-relevant value may be the difference in values between identical modules. In automobile radar ICs, for example, there may be three identical transmitters and four identical receivers from which difference values are obtained. In similar or identical modules, it may be that temperatures, signal levels, and/or supply voltages should only differ by a small percentage from one another, e.g., from one receiver module to any other receiver module.

The BIST component 248 of the fault monitoring system 240 includes circuitry to test the safety-critical circuit 232 of the IC device 230. The BIST component may be configured to enable on-line testing (e.g., concurrent with normal operation or non-concurrent, e.g., during idle time during normal operation) or off-line testing (e.g., production testing and/or validation). In an embodiment, the BIST component includes a circuit to inject faults according to different defect models, e.g., hard stuck-at 0 defects, hard stuck-at 1 defects, resistive stuck-at 0 of 1 defects, hard or resistive bridges between two nodes, cross-talk using a capacitive bridging, transient faults using, for example, a short in time (e.g., transient) stuck-at fault. Unlike the safety monitor 250 (which typically provides a digital output such as pass/fail or ok/not ok), the BIST component outputs a measurement of the safety-critical circuit, such as a measure of noise, sensitivity, and/or crosstalk. Thus, the BIST component can monitor for marginal and/or parametric deviations that might impair the safety of the system, such as an increased noise level, a reduced sensitivity, and/or an increased crosstalk.

The user registers 244 of the fault monitoring system 240 are registers that can be set to a value by a user to control various parameters of the safety-critical circuit 230. For example, a register, or registers, may be set by the fault management component 242 to influence parameters within the safety-critical circuit such as, for example: bias currents of analog circuits; clock signals of analog, analog/mixed-signal, or digital circuits (e.g., adding clock jitter, suppressing clock cycles, or doubling single clock cycles); supply voltages; reference voltages of voltage regulators; gain settings of amplifiers; trim values of voltage regulators, bandgap references, ADCs, etc.; and divider values of PLLs. In an embodiment, values in the user registers can be permanently changed, such as for hard faults (e.g., simulating a complete break-down of a circuit, caused by, for example, a short circuit). In another embodiment, it is possible to change the value of a user register for a short period of time and then change the value of the register back to its original value to simulate a short, or transient, fault. Having the ability to temporarily change the value of a user register is beneficial in that ISO 26262 requires a sufficient "Diagnostic Coverage" for transient faults. In another embodiment, a modified user register could be used to inject a fault such as a marginal, parametric fault, caused, for example, by de-tuning a PLL by 10% or 20%, or by reducing or increasing a reference voltage or current by 10% or 20%.

The gating logic 252 of the fault monitoring system 240 is configured to gate certain signals from being provided to other elements on the IC device 230 and/or from being provided off of the IC device. In the embodiment of FIG. 2, the gating logic 252 includes gating logic 254 for gating functional signals generated from the safety-critical circuit during fault injection and gating logic 256 for gating signals from the safety monitor 250 during fault injection. In an embodiment, the gating logic 252 is controlled by the fault management component 242. For example, the gating logic 256 may be used to gate an error signal from the safety monitor 250 so that the error caused by an injected fault does not propagate to a circuit (e.g., an off-chip circuit) that evaluates and processes the error signal of the safety monitor. In an embodiment, the gating logic 254 gates the functional signals generated from the safety-critical circuit 232 during fault injection so that the functional signals from the safety-critical circuit are not transferred off-chip, e.g., outside of the IC device. In an embodiment, fault injection is performed at an opportune time that allows for the operation of the safety-critical circuit to be interrupted. For example, fault injection may be implemented in a safety-critical circuit that supports a radar function for driver assist in between chirp pulses.

The fault management component 242 of the fault monitoring system 240 manages fault monitoring functions performed by the user registers 244, the ATB component 246, the BIST component 248, and the safety monitor 250. Fault management functions managed by the fault management component may include, for example: triggering a fault injection circuit to modify one more settings of one or more user registers, either permanently or for a short time; checking to see if the safety monitor notices a corresponding fault within the required time frame; and/or checking to see if the BIST component notices a corresponding fault within the required time frame. In an embodiment, the fault management component includes digital circuitry that is configured to process digital data. The fault management component may initiate fault monitoring operations on, for example, regular intervals, at start-up, at power down, and/or on request. In an embodiment, the fault management component is configured to issue an error signal when the safety monitor 250 does not detect a corresponding response to the injected fault. In an embodiment, the process of injecting faults and determining if corresponding faults have been detected is repeated until a desired set of faults has been injected. The fault management component also controls the gating logic 252. For example, the gating logic may be controlled to gate an error signal from the safety monitor 250 so that the error caused by an injected fault does not propagate to a circuit that evaluates and processes the error signal of the safety monitor. In an embodiment, the gating logic is controlled to gate the functional signals generated from the safety-critical circuit 232 during fault injection so that the functional signals from the safety-critical circuit are not transferred off-chip, e.g., outside of the IC device. In an embodiment, the fault management component includes digital circuitry configured to implement fault monitoring logic and may include computer executable code (e.g., software and/or firmware) that is configured to perform the fault management functions.

In an embodiment in accordance with the invention, there is a strict separation between the safety-critical circuit 232 and the components of the safety monitoring system 240. As used herein, "strict separation" between the safety-critical circuit and the components of the safety monitoring system ensures that there is no defect that leads to faults both in the safety-critical circuit and the components of the safety monitoring system. In an embodiment, strict separation between the safety-critical circuit and the components of the safety monitoring system involves a separation of power supply lines, power ground lines, clock signals, enable or reset signals, and test control signals. In an embodiment, the safety-critical circuit is separated from the components of the safety monitoring system in that there is logical separation (e.g., the safety-critical circuit is a separate logical entity/module). Strict separation can also be defined as hierarchical and logical separation e.g., hierarchical also means that the circuit is defined by views like a schematic netlist, timing, layout, etc., which completely define it, as contrasted to views of the BIST, safety monitors, and gating logic respectively. In an embodiment, fault injection components (e.g., the user registers 244 and the ATB component 246) and fault detection components (e.g., the ATB component 246 and the safety monitor 250) are separated from each other. Fault injection components and fault detection components are separated from each other because for determining Diagnostic Coverage, faults detected in the fault detection components do count, whereas faults in the fault injection components do not count. Thus, since it is desirable to separate fault detection components from fault injection components for bookkeeping purposes, it makes sense to separate fault detection components fault injection components in the IC device.

Figure 4:
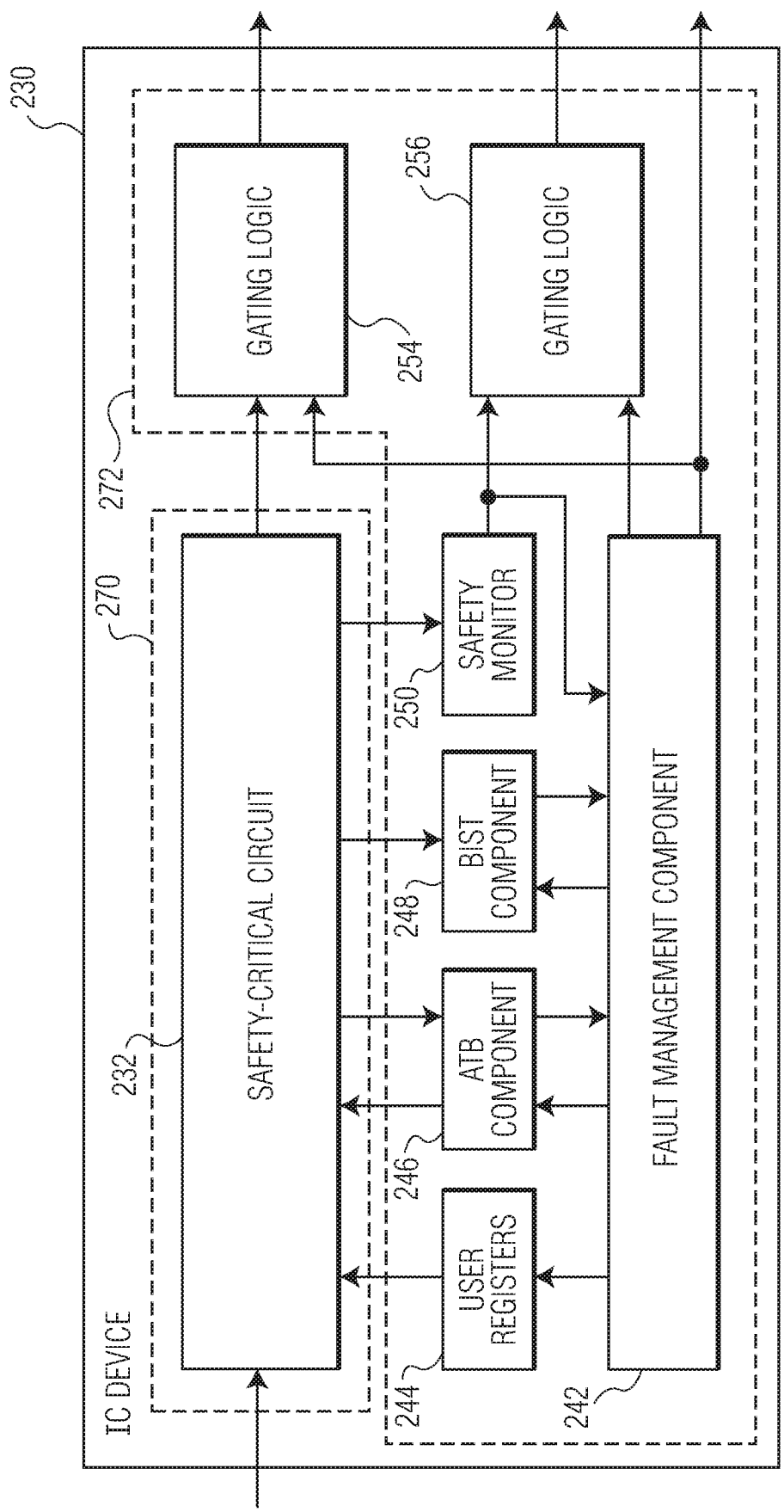
FIG. 4 depicts the IC device of FIG. 2 in which separation of the safety-critical circuit from the components of the safety monitoring system is indicated.

In contrast to conventional IC devices in which only the safety-critical circuit and the safety monitors are required to be separated, in the IC device described herein, there is separation between fault injection components, fault detection/probing components, and the safety-critical circuit. FIG. 4 depicts the IC device 230 of FIG. 2 in which the separation of the safety-critical circuit 232 from the components of the safety monitoring system is indicated. In particular, FIG. 4 identifies a safety-critical circuit domain 270 that includes the safety-critical circuit 232 and a fault monitoring system domain 272 that includes the components of the fault monitoring system, including the user registers 244, the analog test bus component 246, the BIST component 248, the safety monitor 250, the gating logic 252, and the fault management component 242. In an embodiment, the safety-critical circuit domain 270 and the fault monitoring system domain 272 are separated from each other in that, for example, the same fault (e.g., a loss of power) will not be projected on to both the safety-critical circuit and an element of the fault monitoring system. Additionally, although not illustrated with different domains, in an embodiment, the user registers 244, the analog test bus component 246, the BIST component 248, the safety monitor 250, the gating logic 252 are separated from each other.

Using the fault monitoring system 240 as described above, various fault monitoring operations can be implemented to monitor an aspect or aspects of a safety-critical circuit 232. Various aspects of implementing fault monitoring using the above described system are provided below.

In an example, fault injection is triggered by the fault management component 242 through the user registers 244. For example, the user registers are used to directly control properties and/or parameters of an analog or mixed-signal block. For example, parameters such as reference voltages, bias currents, filter characteristics, supply voltages, upper or lower limits of a limiter circuit, and/or a received signal strength indicator (RSSI) circuit can be manipulated through the user registers. In an embodiment, the fault management component provides digital control signals to the user registers to set a value or values in the user registers to trigger the injection of a fault condition into the safety-critical circuit.

In an example, fault injection is triggered by the fault management component 242 through the analog test bus component 246. For example, the analog test bus component can be controlled by the fault management component to manipulate a parameter within the safety-critical circuit such as by increasing or decreasing reference voltages, increasing or decreasing bias currents, modifying the value of a resistor or resistors, and/or modifying the value of a capacitor or capacitors.

In an embodiment, the fault monitoring system 240 can inject faults that are "permanent" in nature, e.g., the state or condition of the faults do not change over relevant periods of time. Examples of permanent faults include hard stuck-at 0, hard stuck-at 1, resistive stuck-at 0 or 1, hard or resistive bridges between two nodes, small parametric deviations of reference voltages or bias currents. Faults such as these may occur in an actual IC device when an unintended particle on the IC device provides a conducting path with more or less high resistance between two nodes.

In an embodiment, the fault monitoring system 240 can inject faults that are "transient" in nature, e.g., the state or condition of the faults changes over time or lasts only a relatively short period of time, e.g., shorter than a clock period. For example, in digital circuits, a transient fault may involve swapping the contents of a flip-flop or swapping the contents of a memory cell of, for example, an SRAM, DRAM, or MRAM. In analog circuits, a transient fault may involve injecting a high, short signal spike that may trigger a safety monitor, or that may cause an Automatic Gain Control (AGC) circuit to change the amplification (e.g., reduce the amplification due to a suddenly increased signal amplitude caused by the transient fault). In mixed-signal circuits, an injected transient fault may lead to, for example, a bit error (e.g., in ADCs and/or DACs), in temporary un-locking (PLLs), and/or in selecting wrong channels (e.g., via multiplexers). The effect of a transient fault may hence be over soon after the transient fault is over, or the transient fault may last longer, in many cases like a swapped flip-flop, latch, or memory cell, the transient fault may last for an undefined period of time. Faults such as these may occur in an actual IC device when a Single Event Upset, caused by cosmic radiation, leads to a temporary generation of electron-hole-pairs in small areas of the silicon of the IC device. The electron-hole-pairs can lead to a conductive channel in small parts of the IC device.

In an embodiment, the fault monitoring system 240 can inject faults while the safety-critical circuit 232 is "on-line." On-line fault injection refers to injection of faults during operation of the safety-critical circuit, e.g., when the safety-critical circuit and associated components are operated in their intended use, e.g., in an application mode. For example, during on-line fault injection, the safety-critical circuit is in its intended operational mode, including wherein operational settings such as bias currents, reference voltages, filter settings, gain settings are set at realistic levels, in contrast to possibly unrealistic levels that might be used in a dedicated test mode. Moreover, external signals that are injected into the safety-critical circuit, are realistic signals, in contrast to signals that may be injected in a dedicated test mode where there might be no input signals at all. In an embodiment, on-line fault injection also includes gating of the outputs of safety monitors and gating of output signals from the safety-critical circuit if the output signals may distract the subsequent circuitry.

In an embodiment, the fault monitoring system 240 can inject faults while the safety-critical circuit 232 is "off-line." Off-line fault injection refers to injecting faults in, for example, a dedicated test mode, which may be at circuit start-up, at circuit power-down, or intermittent to the application mode. It may be desirable to implement off-line fault injection because it may not be necessary to gate off the signals from safety monitors and/or the output signals from the safety-critical circuit and/or because it is possible to inject specially chosen faults and or to manipulate certain parameters that should not be manipulated during on-line operation of the safety-critical circuit. For example, such parameters as bias current settings, reference voltage settings, gain settings, and/or filter settings may be chosen to reflect worst-case conditions in which the safety-critical circuit is most vulnerable to injected defects. In some embodiments, different sets of settings may be found to be the worst-case settings for different fault modes, e.g., one set of settings is worst-case for stuck-at 0 faults, while another set of settings is worst-case for stuck-at 1 faults, and a third set of settings is worst-case for transient faults.

In an embodiment, the fault monitoring system 240 can inject parametric, marginal, and/or transient faults into the safety-critical circuit 232 through the components of the fault monitoring system. Examples of parametric, marginal, and/or transient faults include changes of circuit parameters like resistances, capacitances, inductances, voltages, currents, amplifications, filter corner frequencies, delay times, cross-talk attenuations, power supply rejection ratios, common mode rejection ratios and similar characteristic values of a single component like a resistor, capacitor or transistor, or a sub-module like a current mirror or a single amplification stage, or a complete module like a filter, an ADC a DAC, a PLL or the like.

Figure 5:
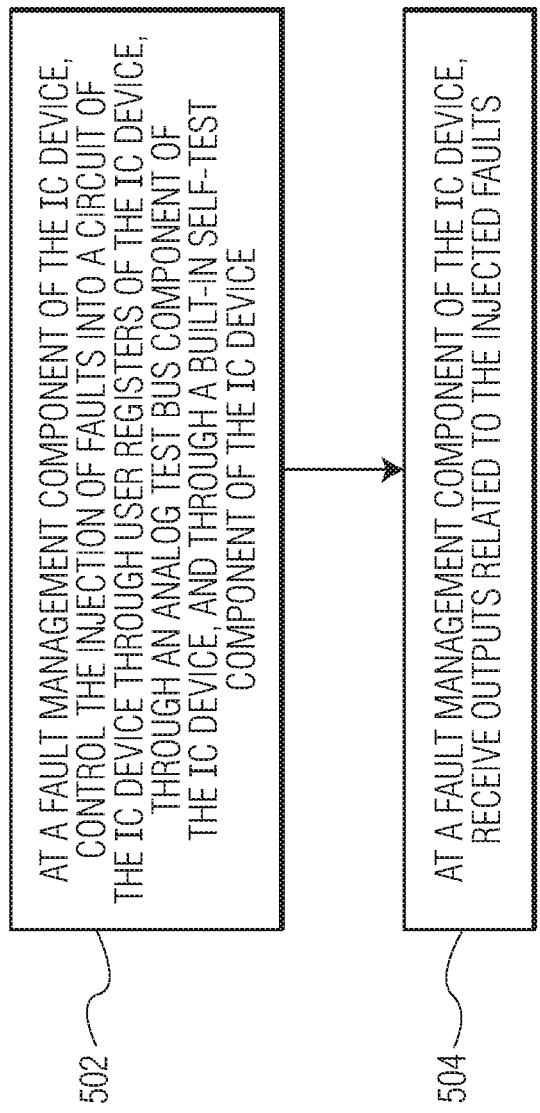
FIG. 5 is a process flow diagram of a method for monitoring faults in an IC device.

FIG. 5 is a process flow diagram of a method for monitoring faults in an IC device. At block 502, at a fault management component of the IC device, the injection of faults into a circuit of the IC device through user registers of the IC device, through an analog test bus component of the IC device, and through a built-in self-test component of the IC device is controlled. At block 504, at the fault management component of the IC device, outputs related to the injected faults are received.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program.

The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments which use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:
1. An integrated circuit (IC) device comprising:
   a circuit configured to perform a function;
   a fault management component configured to manage fault monitoring of the circuit;

at least one user register connected to receive control signals from the fault management component and connected to provide register values to the circuit to control an aspect of the circuit;

an analog test bus component configured to establish connections to nodes in the circuit to convey analog signals to the nodes and to communicate digital signals with the fault management component;

a built-in self-test component connected to the circuit to test the circuit and to communicate digital signals with the fault management component;

a safety monitor component connected to the circuit to receive a signal from the circuit and to output a safety monitor signal in response to the signal received from the circuit; and gating logic configured to gate signals from the circuit and/or from the safety monitor in response to signals from the fault management component;

wherein the circuit is separated from the fault management component, the at least one user register, the analog test bus component, the built-in self-test component, the safety monitor, and the gating logic.

2. The IC device of claim 1, wherein the fault management component is configured to process digital data.

3. The IC device of claim 2, wherein the at least one user register receives digital control signals from the fault management component.

4. The IC device of claim 3, wherein the digital control signals are used to control parameters in the circuit.

5. The IC device of claim 1, wherein the analog test bus component is configured to inject analog signals to the circuit via an analog test bus.

6. The IC device of claim 5, wherein the analog test bus component includes at least one of a digital-to-analog converter (DAC) to convert digital signals from the fault management component to analog signals for injection into the circuit, and an analog-to-digital converter (ADC) to convert analog signals from the circuit to digital signal for the fault management component.

7. The IC device of claim 1, wherein the built-in self-test component is configured to test a safety-critical circuit for parametric deviations.

8. The IC device of claim 1, wherein the safety monitor is configured to monitor at least one of temperature, supply voltage, supply noise, output signal level, inputs signal level, and frequency of a ring oscillator in response to a signal from the circuit.

9. The IC device of claim 1, wherein:

the at least one user register receives digital control signals from the fault management component;

the analog test bus component includes an analog test bus, at least one of a digital-to-analog converter (DAC) to convert digital signals from the fault management component to analog signals for injection into the circuit, and an analog-to-digital converter (ADC) to convert analog signals from the circuit to digital signal for the fault management component;

the built-in self-test component is configured to test a safety-critical circuit for parametric deviations; and the safety monitor is configured to monitor at least one of temperature, supply voltage, supply noise, output signal level, inputs signal level, and frequency of a ring oscillator in response to a signal from the circuit.

10. The IC device of claim 1, wherein the function performed by the circuit is a safety-critical function.

11. The IC device of claim 1, wherein the circuit is separated from the fault management component, the at least one user register, the analog test bus component, the built-in self-test component, the safety monitor, and the gating logic in that the circuit and the components of the fault monitoring system have at least one of separate power supply lines, separate power ground lines, separate clock signals, separate enable and/or reset signals, and separate test control signals.

12. A method for monitoring faults in an integrated circuit (IC) device, the method comprising:

at a fault management component of the IC device, controlling the injection of faults into a circuit of the IC device through user registers of the IC device, through an analog test bus component of the IC device, and through a built-in self-test component of the IC device; and at the fault management component of the IC device, receiving outputs related to the injected faults, wherein outputs related to the injected faults are received as digital values from a safety monitor of the IC device.

13. The method of claim 12, wherein controlling the injection of faults into the circuit of the IC device through user registers of the IC device comprises digitally controlling an aspect of the circuit through a register value of at least one user register of the user registers.

14. The method of claim 12, wherein controlling the injection of faults into the circuit of the IC device through an analog test bus component of the IC device comprises digitally controlling at least one switch to inject a signal into the circuit via an analog test bus.

15. The method of claim 12, wherein controlling the injection of faults into the circuit of the IC device through a built-in self-test component of the IC device comprises digitally controlling the built-in self-test component to inject a fault signal into the circuit using a built-in self-test circuit.

16. The method of claim 12, wherein:

controlling the injection of faults into the circuit of the IC device through user registers of the IC device comprises digitally controlling an aspect of the circuit through a register value of at least one user register of the user registers;

controlling the injection of faults into the circuit of the IC device through an analog test bus component of the IC device comprises digitally controlling at least one switch to inject a signal into the circuit via an analog test bus; and controlling the injection of faults into the circuit of the IC device through a built-in self-test component of the IC device comprises digitally controlling the built-in self-test component to inject a fault signal into the circuit using a built-in self-test circuit.

17. The method of claim 12, wherein an output related to an injected fault is received as a digital state value from a safety monitor of the IC device, wherein the digital state values from the safety monitor reflect the state of an aspect of the circuit.

18. The method of claim 12, wherein the circuit of the IC device performs a safety-critical function.

19. A method for monitoring faults in an integrated circuit (IC) device, the method comprising:

at a fault management component of the IC device, controlling the injection of faults into a circuit of the IC device through user registers of the IC device, through an analog test bus component of the IC device, and through a built-in self-test component of the IC device;

at the fault management component of the IC device, receiving outputs related to the injected faults; and at least one of gating an output from a safety monitor of the IC device during fault injection and gating an output from the circuit of the IC device during fault injection.

* * * * *